(12) United States Patent
Sun

(10) Patent No.: US 8,462,503 B2
(45) Date of Patent: Jun. 11, 2013

(54) AIRFLOW GUIDE MEMBER AND ELECTRONIC DEVICE HAVING THE SAME

(75) Inventor: Zheng-Heng Sun, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 227 days.

(21) Appl. No.: 13/111,978

(22) Filed: May 20, 2011

(65) Prior Publication Data

US 2012/0218708 A1    Aug. 30, 2012

(30) Foreign Application Priority Data

Feb. 25, 2011   (CN) .......................... 2011 1 0046313

(51) Int. Cl.
*H05K 7/20* (2006.01)

(52) U.S. Cl.
USPC ................. 361/695; 361/679.47; 361/679.48; 361/679.5; 361/694; 165/80.2; 165/80.3; 165/104.33; 165/121; 165/122; 165/185; 454/184

(58) Field of Classification Search
USPC ....... 361/679.46–679.55, 690–697, 715–724; 165/80.2, 80.3, 104.33, 121–126, 185; 174/15.1, 174/16.3, 252; 257/706–727
See application file for complete search history.

(56) References Cited

U.S. PATENT DOCUMENTS

| | | | | |
|---|---|---|---|---|
| 4,765,397 A * | 8/1988 | Chrysler et al. | .......... | 165/104.33 |
| 5,440,450 A * | 8/1995 | Lau et al. | ........................ | 361/695 |
| 5,676,198 A * | 10/1997 | Schneider et al. | ............ | 165/80.3 |
| 7,443,680 B1 * | 10/2008 | Peng et al. | .................... | 361/704 |
| 7,929,304 B2 * | 4/2011 | Cao et al. | ...................... | 361/697 |
| 8,081,453 B2 * | 12/2011 | Sun | .............................. | 361/690 |
| 8,373,986 B2 * | 2/2013 | Sun | .............................. | 361/695 |
| 2007/0274038 A1 * | 11/2007 | Sun | .............................. | 361/695 |
| 2012/0224325 A1 * | 9/2012 | Sun et al. | ...................... | 361/695 |

FOREIGN PATENT DOCUMENTS

JP   02007329253 A  * 12/2007

* cited by examiner

*Primary Examiner* — Michail V Datskovskiy
(74) *Attorney, Agent, or Firm* — Altis Law Group, Inc.

(57) ABSTRACT

An electronic device includes a bottom plate, a circuit board, a fan, and an airflow guide member. The circuit board is fixed to the bottom plate. The fan is arranged at the front of the circuit board. The airflow guide member is arranged between the fan and the circuit board. The airflow guide member includes an airflow guide wall for guiding most of airflow upwards to the top of the circuit board. A number of slots is defined in the airflow guide wall, for allowing only a minimum portion of the airflow to flow underneath the circuit board.

12 Claims, 4 Drawing Sheets

AIRFLOW GUIDE MEMBER AND ELECTRONIC DEVICE HAVING THE SAME

CROSS-REFERENCE TO RELATED APPLICATIONS

Relevant subject matter is disclosed in a co-pending U.S. patent application Ser. No. 13/111,979 filed on the same date and having a same title with the present application, which is assigned to the same assignee as named herein.

BACKGROUND

1. Technical Field

The present disclosure relates to an airflow guide member and an electronic device having the airflow guide member.

2. Description of Related Art

Typically, a fan is mounted in an electronic device to direct air from outside into the electronic device, for forming airflow in a direction to cool a plurality of electronic components on a motherboard mounted in the electronic device. However, some of the airflow is blown underneath the motherboard where it is not effective in heat dissipation.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawing, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
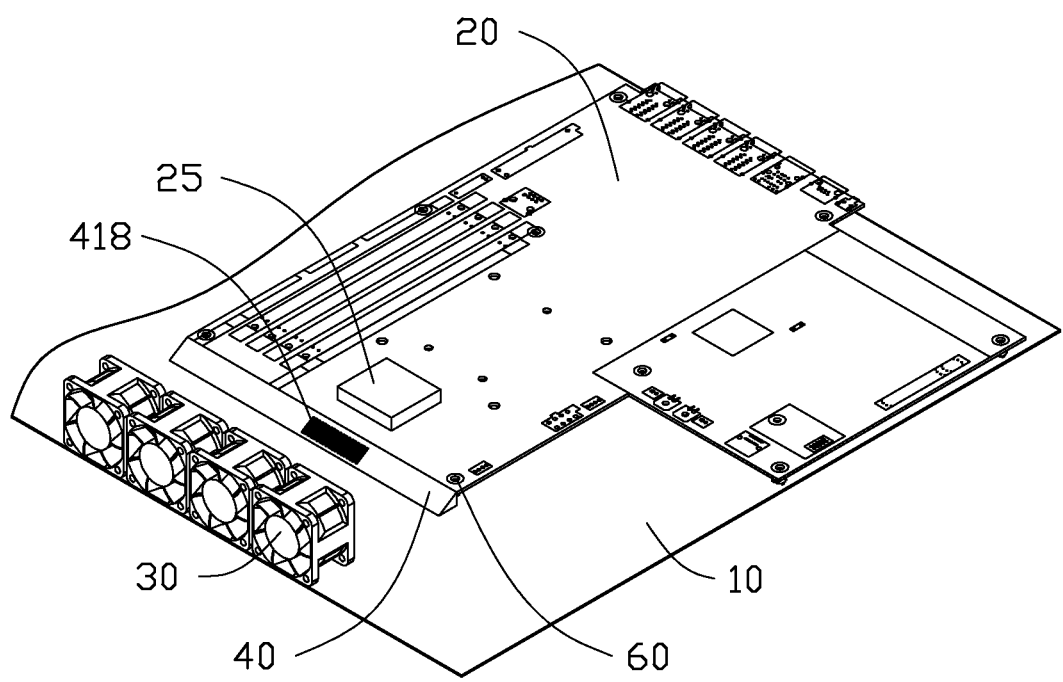
FIG. 1 is an assembled, isometric view of an embodiment of an electronic device, the electronic device including an airflow guide member.
Figure 2:
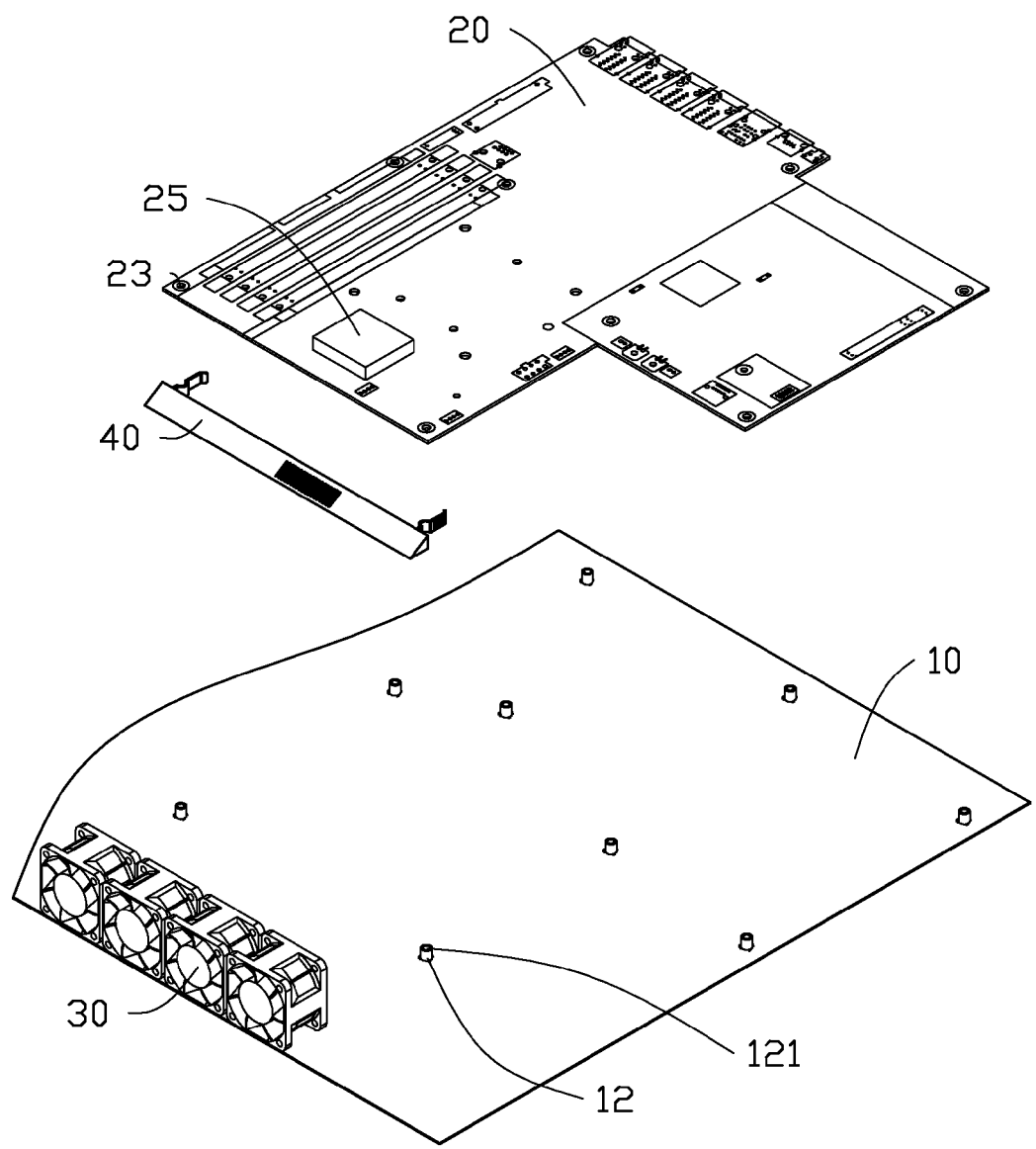
FIG. 2 is an exploded, isometric view of FIG. 1.

Referring to FIGS. 1 and 2, an embodiment of an electronic device includes a bottom plate 10, a circuit board 20, a plurality of fans 30, and an airflow guide member 40.

A plurality of posts 12 is formed on the bottom plate 10. A threaded hole 121 is defined in each post 12.

A plurality of fixing holes 23 is defined in the circuit board 20 corresponding to the threaded holes 121 of the bottom plate 10. An electronic component 25 is installed on the circuit board 20.

Figure 3:
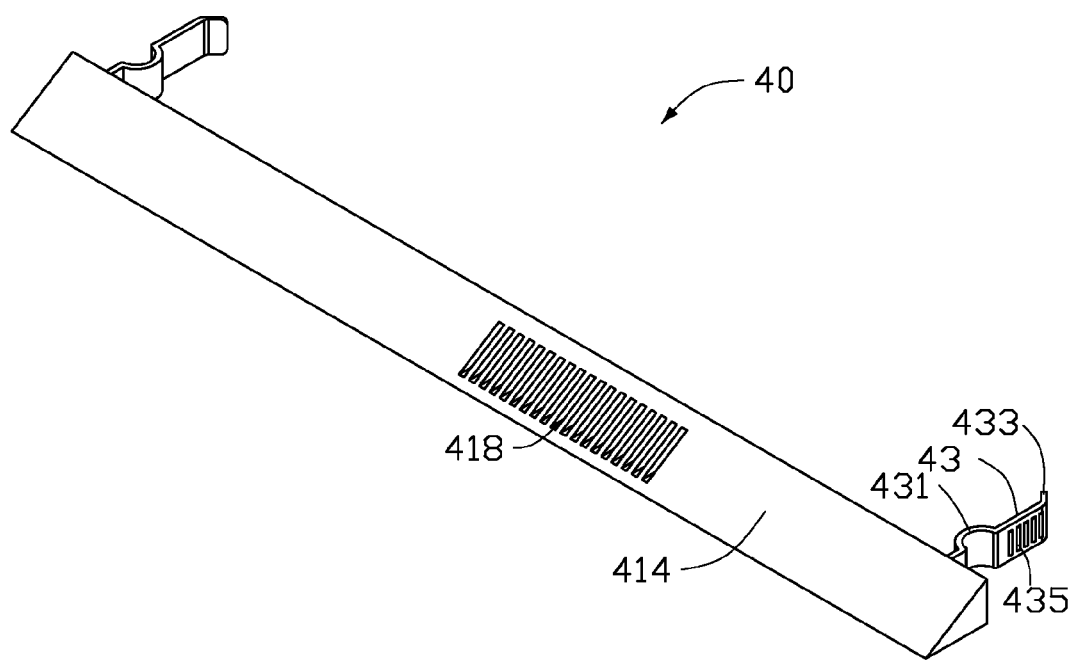
FIG. 3 is an enlarged, isometric view of the airflow guide member of FIG. 2.
Figure 4:
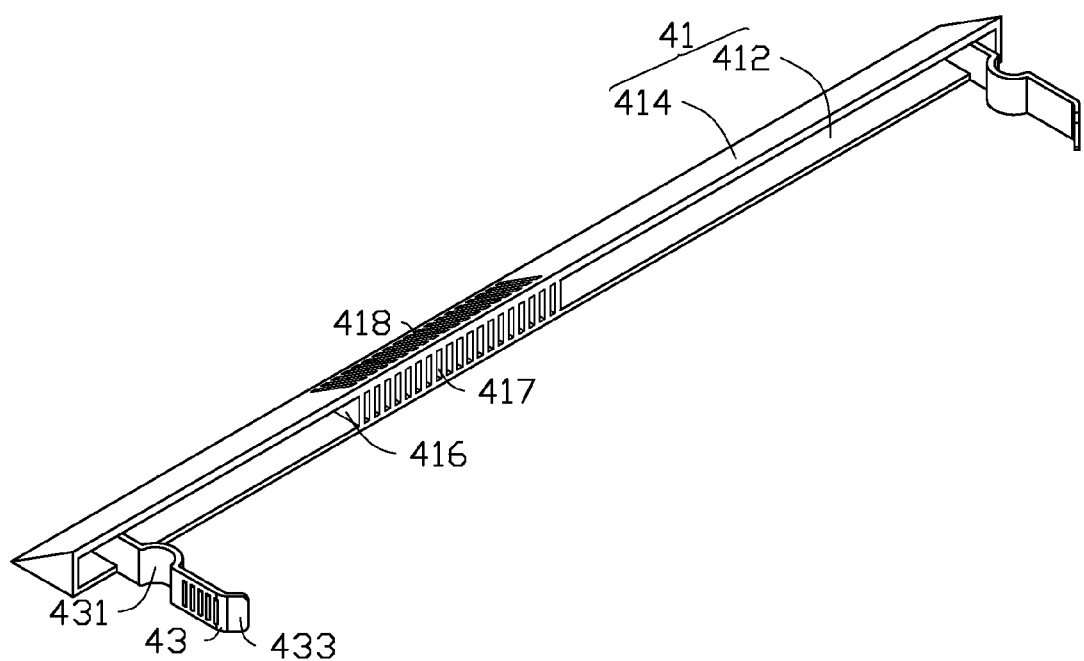
FIG. 4 is similar to FIG. 3, but viewed from another perspective.

Referring to FIGS. 3 and 4, the airflow guide member 40 includes an elongated main body 41, and two resilient arms 43 extending rearwards from the main body 41. The main body 41 is triangular-prism shaped, and includes a bottom wall 412, and an airflow guide wall 414 slantingly extending up and back from a front long side of the bottom wall 412. A plurality of right triangle shaped plates 416 is perpendicularly connected between the airflow guide wall 414 and the bottom wall 412. An interspace 417 is bounded by every two adjacent plates 416 and extends through the airflow guide wall 414 to form a slot 418. First ends of the resilient arms 43 are connected between the airflow guide wall 414 and the bottom wall 412 adjacent to opposite ends of the main body 41, respectively. Second ends of the resilient arms 43 opposite to the first ends are bent towards each other, and respectively form a slanted surface 433. Middle sections of the resilient arms 43 are bent towards each other, and respectively form an arc-shaped hook 431. A plurality of skid-resistant protrusions 435 is formed on an outer surface of each resilient arm 43 between the corresponding hook 431 and slanted surface 433.

In assembly, the circuit board 20 is placed on the posts 12 of the bottom plate 10. A plurality of screws 60 are respectively extended through the fixing holes 23 and engaged in the corresponding threaded holes 121, to fix the circuit board 20 to the bottom plate 10. The fans 30 are arranged on the bottom plate 10 at the front of the circuit board 20. The airflow guide member 40 is arranged between the circuit board 20 and the fans 30, with the airflow guide wall 414 facing the fans 30. The resilient arms 43 of the airflow guide member 40 are inserted into a space between the circuit board 20 and bottom plate 10, to allow the slanted surfaces 433 to abut against two corresponding posts 12 adjacent to the fans 30. The airflow guide member 40 is pushed towards the circuit board 20, the resilient arms 43 are deformed towards each other until the hooks 431 respectively align with the corresponding posts 12. The resilient arms 43 restore, and the corresponding posts 12 respectively engage in the hooks 431, fixing the airflow guide member 40 to the bottom plate 10. A rear side of the airflow guide wall 414 abuts against a front side of the circuit board 20. The slots 418 and the interspaces 417 are located directly in front of the bottom of the electronic component 25.

When the electronic device works, the fans 30 blow air to the circuit board 20. Some of the airflow directly flows over the circuit board 20, and some of the airflow passes over the airflow guide wall 414 and then flows over the circuit board 20. The airflow above the circuit board 20 can provide efficient heat dissipation for the electronic component 25 and other heat elements installed on the circuit board 20. A little of the airflow goes through the slots 418 and the interspaces 417, and flows underneath the circuit board 20, to dissipate heat for the electronic component 25 from a bottom surface of the circuit board 20. In this embodiment, the airflow guide member 40 can guide most of the airflow upwards to the top of the circuit board 20, and allow just a minimum portion of the airflow to flow underneath the circuit board 20, which improves effectiveness of the airflow and enhances heat dissipation efficiency of the electronic device.

To detach the airflow guide member 40 from the bottom plate 10, the sections of the resilient arms 43 having the skid-resistant protrusions 435 are pressed toward each other, to allow the hooks 431 of the resilient arms 43 to be disengaged from the corresponding posts 12. Thereby, the airflow guide member 40 can be detached.

In other embodiments, the bottom wall 412 of the airflow guide member 40 can be omitted, the airflow guide wall 414 and the plates 416 can be directly supported by the bottom plate 10. The resilient arms 43 of the airflow guide member 40 can be omitted, the airflow guide member 40 can be fixed to the bottom plate 10 through use of other fixing device, such as screws or latches.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An airflow guide member, comprising:
an elongated main body comprising an airflow guide wall slantingly extending up, and a plurality of spaced plates connected to the airflow guide wall, wherein an interspace is bounded by every two adjacent plates and extending through the airflow guide wall.

2. The airflow guide member of claim 1, wherein the plates are substantially perpendicular to the airflow guide wall.

3. The airflow guide member of claim 2, wherein the main body is elongated and the plates are spaced in the lengthwise direction of the main body.

4. The airflow guide member of claim 3, wherein the main body further comprises a bottom wall, the airflow guide wall slantingly extends up and back from a front long side of the bottom wall, the plates are perpendicularly connected between the airflow guide wall and the bottom wall.

5. The airflow guide member of claim 1, further comprising two resilient arms extending rearwards from the airflow guide wall, middle sections of the resilient arms are bent towards each other, and respectively form an arc-shaped hook.

6. The airflow guide member of claim 5, wherein distal ends of the resilient arms are bent towards each other, and each form a slanted surface.

7. An electronic device, comprising:
a bottom plate;
a circuit board fixed to the bottom plate, with a space defined between the circuit board and the bottom plate, an electronic component installed on the circuit board;
a fan fixed to the bottom plate aligning with a front side of the circuit board; and
an airflow guide member fixed to the bottom plate between the fan and the circuit board, the airflow guide member comprising an elongated airflow guide wall slantingly extending up relative to the bottom plate, and a plurality of spaced plates connected to the airflow guide wall, a slot defined in the airflow guide wall between every two adjacent plates, wherein a rear side of the airflow guide wall abuts against the front side of the circuit board, the slots are directly located in front of the bottom of the electronic component.

8. The electronic device of claim 7, wherein the plates are perpendicular to the airflow guide wall.

9. The electronic device of claim 8, wherein the plates are spaced in the lengthwise direction of the airflow guide wall.

10. The electronic device of claim 9, wherein the airflow guide member further comprises a bottom wall parallel with the circuit board, the airflow guide wall slantingly extends up and back from a front long side of the bottom wall, the plates are perpendicularly connected between the airflow guide wall and the bottom wall.

11. The electronic device of claim 7, wherein a plurality of posts is formed on the bottom plate, the circuit board is supported on the posts, the airflow guide member further comprises two resilient arms extending rearwards from the airflow guide wall, middle sections of the resilient arms are bent towards each other, and respectively form an arc-shaped hook, to engage with two corresponding posts of the bottom plate.

12. The electronic device of claim 11, wherein distal ends of the resilient arms are bent towards each other, and each form a slanted surface.

* * * * *